(12) United States Patent
Piec et al.

(10) Patent No.: US 7,642,806 B2
(45) Date of Patent: Jan. 5, 2010

(54) TEST APPARATUS, SYSTEM, AND METHOD WITH A MAGNETIC FEATURE

(75) Inventors: Zbigniew S. Piec, San Diego, CA (US); David E. Corbett, San Diego, CA (US); Alan R. Langhorn, Solana Beach, CA (US)

(73) Assignee: General Atomics, San Diego, CA (US)

( * ) Notice: Subject to any disclaimer, the term of this patent is extended or adjusted under 35 U.S.C. 154(b) by 408 days.

(21) Appl. No.: 11/549,587

(22) Filed: Oct. 13, 2006

(65) Prior Publication Data

US 2008/0150572 A1 Jun. 26, 2008

(51) Int. Cl.
*G01R 31/34* (2006.01)

(52) U.S. Cl. ...................................................... 324/772

(58) Field of Classification Search ................. 324/772; 310/45, 178, 251
See application file for complete search history.

(56) References Cited

U.S. PATENT DOCUMENTS

| | | | |
|---|---|---|---|
| 3,586,894 A | 6/1971 | Mueller | |
| 3,648,088 A | 3/1972 | Wilken et al. | |
| 3,657,580 A | 4/1972 | Doyle | |
| 3,944,865 A | 3/1976 | Jewitt | |
| 4,246,507 A | 1/1981 | Weldon et al. | |
| 4,267,476 A | 5/1981 | Lee | |
| 4,358,699 A | 11/1982 | Wilsdorf | |
| 4,415,635 A | 11/1983 | Wilsdorf et al. | |
| 4,686,405 A | 8/1987 | McKee | |
| 4,698,540 A | 10/1987 | McKee | |
| 4,710,665 A | 12/1987 | Kilgore et al. | |
| 5,049,771 A | 9/1991 | Challita et al. | |
| 5,451,825 A | 9/1995 | Strohm | |
| 5,530,309 A | 6/1996 | Weldon | |
| 5,587,618 A | 12/1996 | Hathaway | |
| 5,844,345 A | 12/1998 | Hsu | |
| 5,917,428 A | 6/1999 | Discenzo et al. | |
| 6,489,700 B1 | 12/2002 | Heiberger et al. | |
| 6,586,858 B1 | 7/2003 | Finkle | |
| 6,753,635 B2 | 6/2004 | Kuhlmann-Wilsdorf | |
| 6,873,078 B1 | 3/2005 | Piec et al. | |

*Primary Examiner*—Eric S McCall
(74) *Attorney, Agent, or Firm*—Fitch, Even, Tabin & Flannery

(57) ABSTRACT

A magnetic test apparatus, in accordance with one embodiment, comprising a rotor coupled to a drive shaft, wherein the drive shaft is mechanically coupled to a drive system; a stator coupled to at least one brush holder; at least one brush held by the brush holder, wherein the brush is held in contact with the rotor; a housing for supporting the rotor and the stator; and a magnet for providing a magnetic field in the vicinity of the at least one brush.

18 Claims, 5 Drawing Sheets

SECTION A-A

TEST APPARATUS, SYSTEM, AND METHOD WITH A MAGNETIC FEATURE

GOVERNMENT RIGHTS

This invention was made with support of the government under Navy Contract No. N00014-04-C-0618 Office of Naval Research. The Government may have certain rights in this invention.

BACKGROUND OF THE INVENTION

1. Field of the Invention

The present invention relates to a magnetic test apparatus. More specifically, the present invention relates to a magnetic test apparatus for testing brushes and brush holders in the presence of a magnetic field.

2. Discussion of the Related Art

Evaluation of multi-conductor metallic brushes for electric propulsion motors and generators is important in assuring reliable operation of the motors, generators and vehicle or vessel they are utilized with. The complex operational environment of a large number of brushes can be simulated by a computer program, however, it is preferable that the computer results be validated by laboratory testing. Additionally, brushes can be evaluated after being actually used in a motor, however, these brushes are not easily accessible. Furthermore, it is not practical, in many instances to disassemble the motor during use in order to evaluate the brushes. Previously, brushes have been evaluated using a test apparatus that includes a motor driven rotor. The brushes are held in contact with the rotor the wear on the brushes can be evaluated. However, this type of test apparatus lacks many real world operating conditions.

Motors and generators can be subjected to high magnetic field strengths and varying environmental conditions while in use. These high varying magnetic fields and varying environmental conditions that can be present in electric propulsion motors and generators create a need for an apparatus to simulate the conditions of the motors and generators. Thus, there is a need for a measurement apparatus for testing brushes and brush holders under varying magnetic fields and environmental conditions.

SUMMARY OF THE INVENTION

The present embodiments provide a magnetic test apparatus that can test many brushes and brush holders under varying magnetic fields and varying environmental conditions. The magnetic test apparatus can be used with measurement instruments to evaluate the performance of the brushes and brush holders within controlled operating conditions.

One embodiment can be characterized as a magnetic test apparatus comprising a rotor coupled to a drive shaft, wherein the drive shaft is mechanically coupled to a drive system; a stator coupled to at least one brush holder; at least one brush held by the brush holder, wherein the brush is held in contact with the rotor; a housing for supporting the rotor and the stator; and a magnet for providing a magnetic field in the vicinity of the at least one brush.

Another embodiment includes a magnetic test apparatus system comprising a magnetic test apparatus comprising a stator; a brush holder coupled to the stator; a brush held by the brush holder; a rotor position to contact the brush; a drive shaft coupled to the rotor; and a magnet for supplying a magnetic field where the brush contacts the rotor; a drive system coupled to the drive shaft; a power supply for providing power to the brushes; and a power supply for providing power to the magnet.

Another subsequent embodiment can be characterized as a method of testing one or more brushes comprising rotating a rotor of a magnetic test apparatus; providing power from a brush power supply to at least one brush in contact with the rotor; providing power from a magnet power supply to a magnet; and generating a magnetic field from the magnet in the vicinity of the brush and the rotor.

BRIEF DESCRIPTION OF THE DRAWINGS

The above and other aspects, features and advantages of the present invention will be more apparent from the following more particular description thereof, presented in conjunction with the following drawings, wherein.

Figure 1:
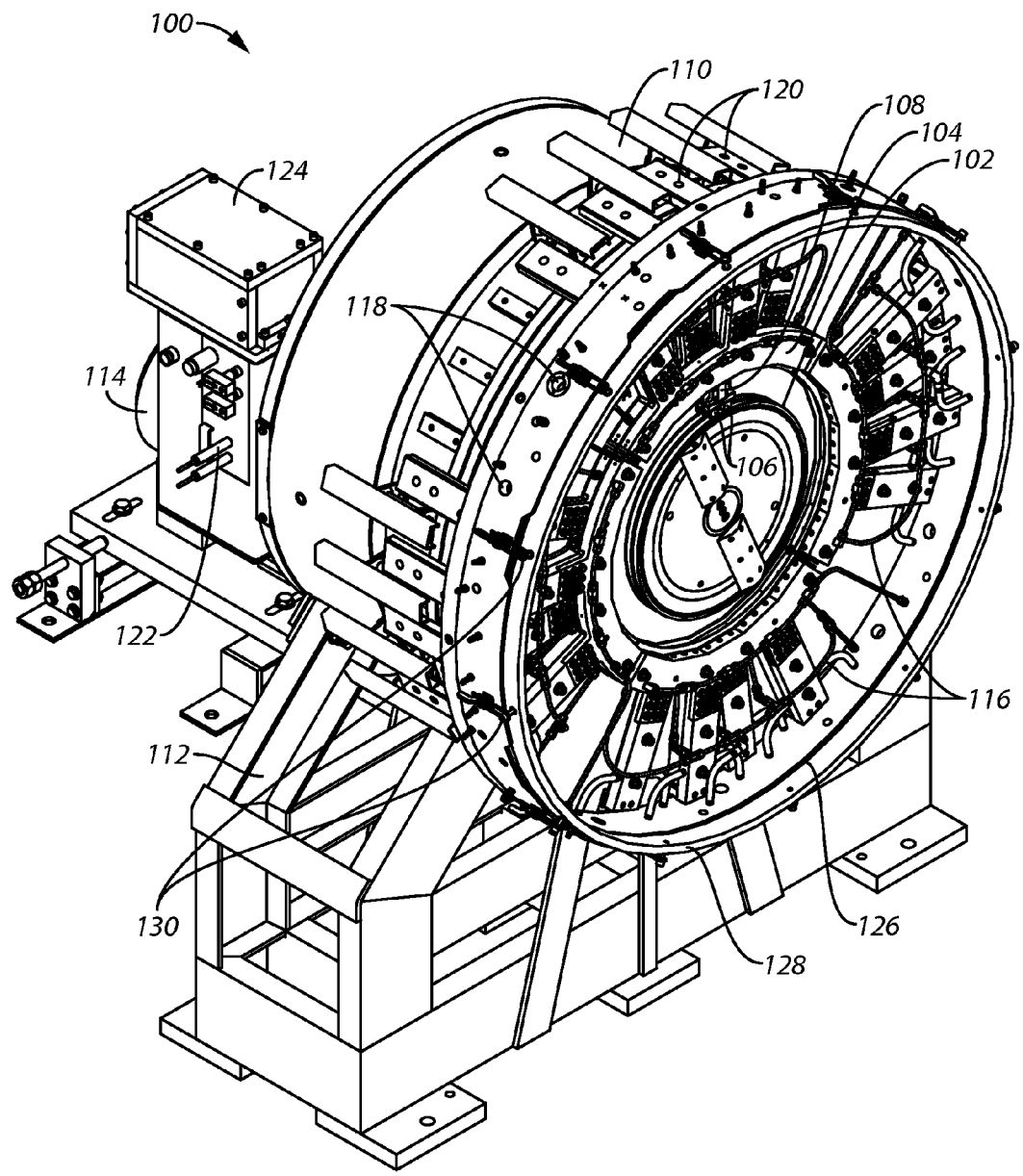
FIG. 1 is an elevated perspective diagram of a front side of a magnetic test apparatus in accordance with various embodiments of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions, sizing, and/or relative placement of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will also be understood that the terms and expressions used herein have the ordinary meaning as is usually accorded to such terms and expressions by those skilled in the corresponding respective areas of inquiry and study except where other specific meanings have otherwise been set forth herein.

DETAILED DESCRIPTION

The following description is not to be taken in a limiting sense, but is made merely for the purpose of describing the general principles of the invention. The scope of the invention should be determined with reference to the claims. The present embodiments address the problems described in the background while also addressing other additional problems as will be seen from the following detailed description.

The embodiments described herein provide an apparatus for testing brushes in a variety of different conditions. The brushes can be subjected to a magnetic field such as would be present in real applications. Because the brushes of homopolar machines can be the greatest source of failure, being able to test various brushes under a variety of different conditions is advantageous. Additionally, some embodiments provide the ability to test and measure the brush performance under many different environmental situations. The long term evaluation of brushes under typical motor operating conditions can be monitored in order to improve wear rate, current density, efficiency and reliability. Additionally, the interactions between the brushes and the rotor contact surface can be evaluated.

Advantageously, in some embodiments, both magnetic field components (Br and Bz) can be adjusted in the vicinity of the brushes and brush holders.

In various embodiments, the brushes can be evaluated over a large variation in the disc surface speed. Additionally, the brushes can be evaluated with different additives at the interface between the brush and the rotor. The brushes can also be evaluated for losses due to Ohmic heating resulting from transfer and circulating currents, and mechanical losses resulting from friction.

The long term performance of the brushes can be evaluated based upon the azimuthal location of the brush and holders as well as the effect of wear particle accumulation of the long term performance.

Advantageously, the evaluation of the brushes under different ranges of coverage factors can be performed. Additionally, the thermal limits and operational envelope of the brushes and the brush holders can be evaluated. Different brush designs and the evaluation of brushes under different duty cycles can be evaluated.

The validation of parameters from both a microscopic and macroscopic analysis and modeling can be done. Furthermore, the accumulation of data to support statistical analysis for the projection of a lifetime for the brushes can be accomplished for a large number of brushes.

Advantageously, the magnetic test apparatus, in some embodiments, can be operated unattended, 24 hours per day, for extended periods of time.

The above features can be accomplished in various embodiments of the apparatus described herein. The following description of a magnetic test apparatus in accordance with various embodiments will further describe and detail the above features.

Referring now to FIG. 1, an elevated perspective diagram of a front side of a magnetic test apparatus 100 is shown in accordance with various embodiments of the present invention. Shown is a rotor 102, a stator 104, a set of brushes 106, a brush holder 108, a machine housing 110, a support structure 112, a drive system 114, a plurality of gas delivery tubes 116, a plurality of connectors for a data acquisition system 118, a plurality of power supply connectors 120, a magnet power supply connector 122, a cryo-compressor 124, an environmental chamber housing 126 a support ring 128, and a plurality of attachment clips 130.

The brush holder 108 is connected to the stator 104 and holds the brushes 106 in contact with the rotor 102. The rotor 102 and stator 104 are held in place by the machine housing 110 and the support structure 112 The embodiment shown includes only one brush holder 108, however, a plurality of brush holders can be connected to the stator 104. The plurality of gas delivery tubes 116 are coupled to the brush holders and supply gas (e.g., carbon dioxide) that controls the pressure that the brushes 106 are held in contact with the rotor 102. In the embodiment shown, there are two brushes 106 and one brush holder 108, however, it should be understood that many brushes and brush holders are placed around the stator in some embodiments. Additionally, as will be shown in FIG. 4, the brushes and brush holders are placed on both an inner and outer side of the stator in some embodiments. The test apparatus is capable of testing up to 120 brushes at one time. In order to hold 120 brushes, there are twenty brush holders on the outside of the stator 104 and twenty brush holders on the inside of the stator 104 (shown in FIG. 4). Each brush holder can be configured to hold two or three brushes. Thus, in the embodiment shown, when the magnetic test apparatus 100 is fully loaded, there are 120 brushes being tested at one time.

The plurality of power supply connectors 120 are generally connected to a power supply (not shown). The power supply supplies power to the magnetic test apparatus and controls the current flowing from the stator, through the brushes and into the rotor. The drive system 114 (shown in more detail in FIG. 3) is used to rotate the rotor 102 as current is being run through the brushes 106. Additionally, a magnetic field is produced by a magnet (shown in FIG. 4) such that the brushes 106 are subjected to a magnetic field. The magnetic field simulates the environment the brushes would be subjected to in a motor that is in use. The magnet which can produce magnetic fields over a range of strengths and is powered by a magnet power supply. The magnet power supply is coupled to the magnet through the magnet power supply connector 122. The cyrocompressor 124 cools the magnet. In one embodiment, the magnet is a super-conducting magnet that operates at approximately 4.2 degrees Kelvin. The magnet produces a magnetic field when charged by the power supply. The strength of the field varies depending upon the level of charge of the magnet. In one embodiment, the proportion of the axial and radial portions of the magnetic filed (Bz and Br) in the brush operating region are controlled by varying the charge of the magnet and also by adjusting the axial position of the rotor 102 and brushes 106 relative to the magnet.

The environmental chamber housing 126 is attached to the front of the machine housing. The environmental chamber housing 126 encloses the rotor 102, the stator 104 and the brushes 106 inside of an environmentally controlled chamber. The environmental chamber housing 126 comprises, in the exemplary embodiment, the support ring 128, the plurality of attachment clips 130, and a front plate. The front plate is made from, for example glass or plastic and is preferably light transmissive such that the brushes can be viewed during operation. The environmental chamber housing 126 allows for the brushes to be tested under a variety of different environmental conditions such as with different temperatures and different gasses. Because the front plate is generally made from a transmissive material, it is not shown in the figure, however, the front plate forms a seal on the inside of the support ring.

Figure 2:
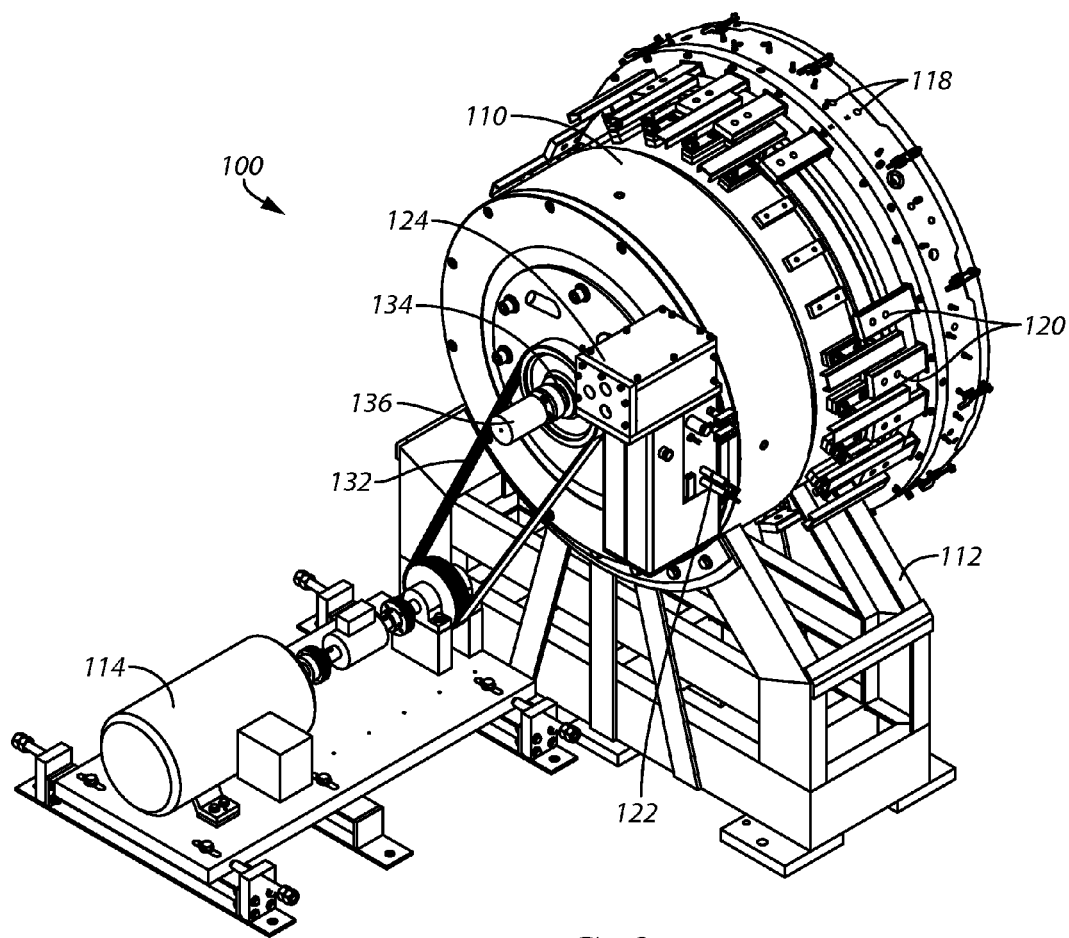
FIG. 2 is an elevated perspective diagram of a back side of the magnetic test apparatus shown in FIG. 1 in accordance with various embodiments of the present invention.

Referring to FIG. 2 an elevated perspective diagram is shown of a back side of the magnetic test apparatus shown in FIG. 1 in accordance with various embodiments of the present invention. Shown is the machine housing 110, the support structure 112, the drive system 114, the plurality of connectors for the data acquisition 118 system 118, the plurality of power supply connectors 120, the magnet power supply connector 122, the cryo-compressor 124, a drive belt 132, a drive shaft 134, and a water union 136.

The drive system 114 is coupled to the drive shaft 134 through the drive belt 132. The drive system 114 rotates the drive shaft 134 of the test apparatus in a controlled manner. The drive system 114, in one embodiment, is a variable frequency controlled electric motor and drive belt system that can produce a rotor speed of up to 30 m/s. Because the magnetic test apparatus 100 includes the drive shaft 134 and additionally the magnet, the test apparatus is not a true motor. As described above, the magnets are charged as the rotor 102 is rotated and current is driven trough the brushes 106. This creates torque which must be compensated by the drive system 114. Thus, there is a balance between the drive system 114 and the magnetic that is taken into account when operating the magnetic test apparatus 100. Generally, in a motor the rotor has many windings creating a large amount of torque, however, the present embodiment of the magnetic test apparatus 100 only includes one winding, thus reducing the generated torque.

As described, in one embodiment, the drive system 114 is a variable frequency drive (VFD) that is used to control the speed of the rotor 102. The VFD controls the speed of the motor that in turn drives the rotor 102. In operation, the VFD will maintain a constant revolutions per minute (RPM) of the rotor. The current passing through the brushes and rotor 102 in the magnetic field generated by the magnet will either add or reduce torque on the rotor 102 (i.e. either try to accelerate or brake the rotor). If the current is trying to accelerate the rotor 102, the VFD must provide braking torque to maintain a constant RPM of the rotor. If the current is trying to decelerate the rotor, the VFD will provide additional torque to maintain the constant RPM of the rotor. In one embodiment, the VFD is a commercially available unit with an internal chopper to allow dissipation of braking energy. The energy is dissipated into an external, water cooled, braking resistor. The VFD settings may be made at the front panel of the VFD or remotely via an Ethernet port. The Ethernet port also allows for remote monitoring of the status of the VFD.

A water cooling system is connected to the water union 136. The water cooling system is a controllable cooling system for the rotor 102 and stator 104. This allows the brushes to be tested at varying degrees of operation and also prevents the rotor 102 and the stator 104 from overheating. Water is supplied to the water union 136 through water hoses (not shown). The water union 136 is designed such that the drive shaft 134 can rotate while the water union 136 remains in place. In one embodiment, the water union 136 is a hydraulic rotary union mounted to the end of the drive shaft 136 which passes water down holes in the drive shaft 136 and into the slip rings. Supply and return hoses from the cooling water system connect to the hydraulic rotary union and also to plumbing connected to the stator bus bars.

Figure 3:
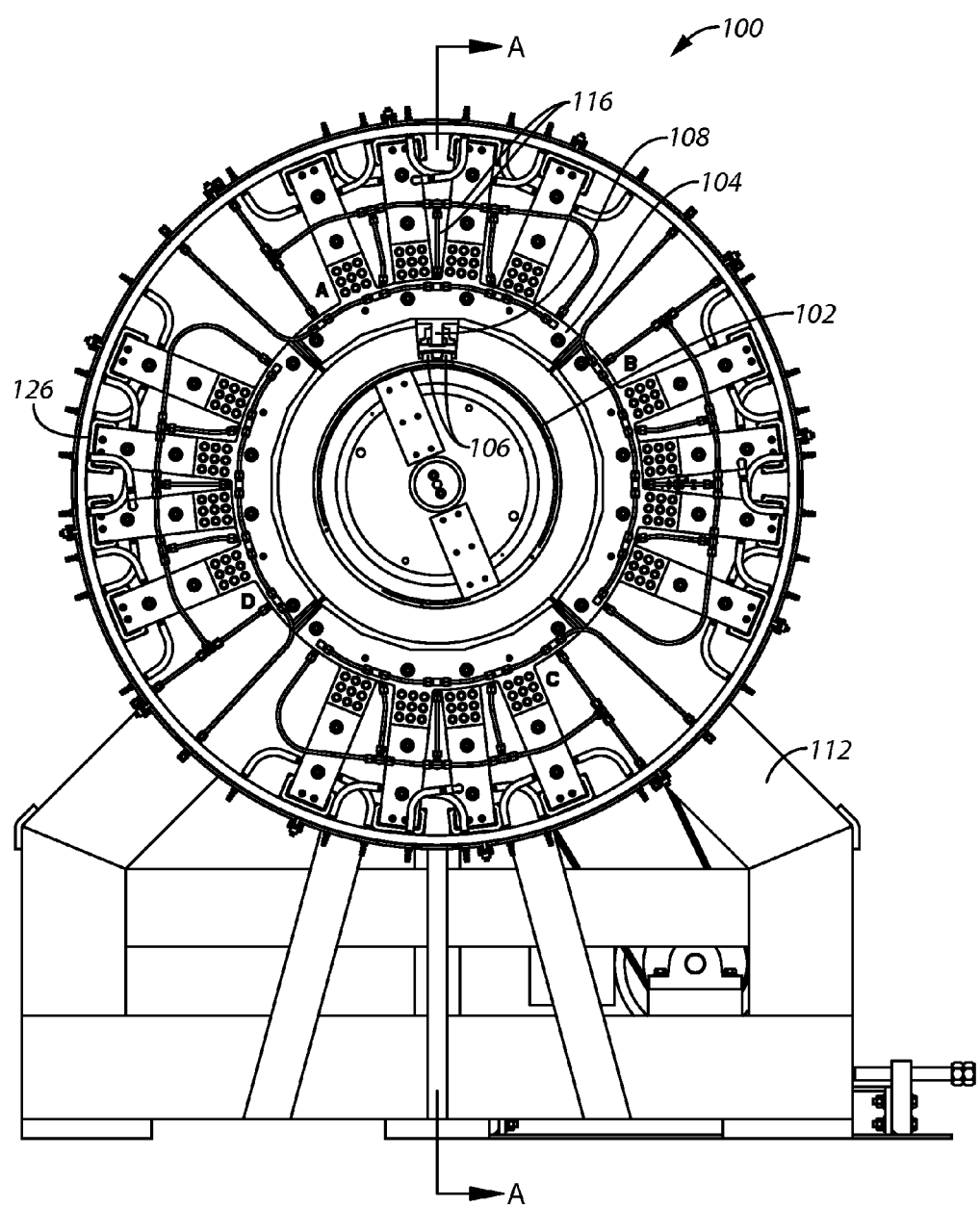
FIG. 3 is a diagram illustrating a front side of the magnetic test apparatus shown in FIG. 1 in accordance with various embodiments of the present invention.

Referring to FIG. 3 a diagram illustrating a front side of the magnetic test apparatus shown in FIG. 1 is shown in accordance with various embodiments of the present invention. Shown is the rotor 102, the stator 104, the brushes 106, the brush holder 108, the support structure 112, the plurality of gas delivery tubes 116, and the environmental chamber housing 126.

The stator 104 is divided into four sections. Each section can hold up to five brush holders. The plurality of gas delivery tubes 116 supply gas to each of the brush holders, thus controlling the pressure the brushes 106 contact the rotor 102. In one embodiment, the rotor 102 is an electrically shorted double slip ring mounted onto a stainless steal wheel and shaft. Each section of the stator 104 comprises two stacked copper bus bars mounted to a back plate (shown below in FIG. 4).

Figure 4:
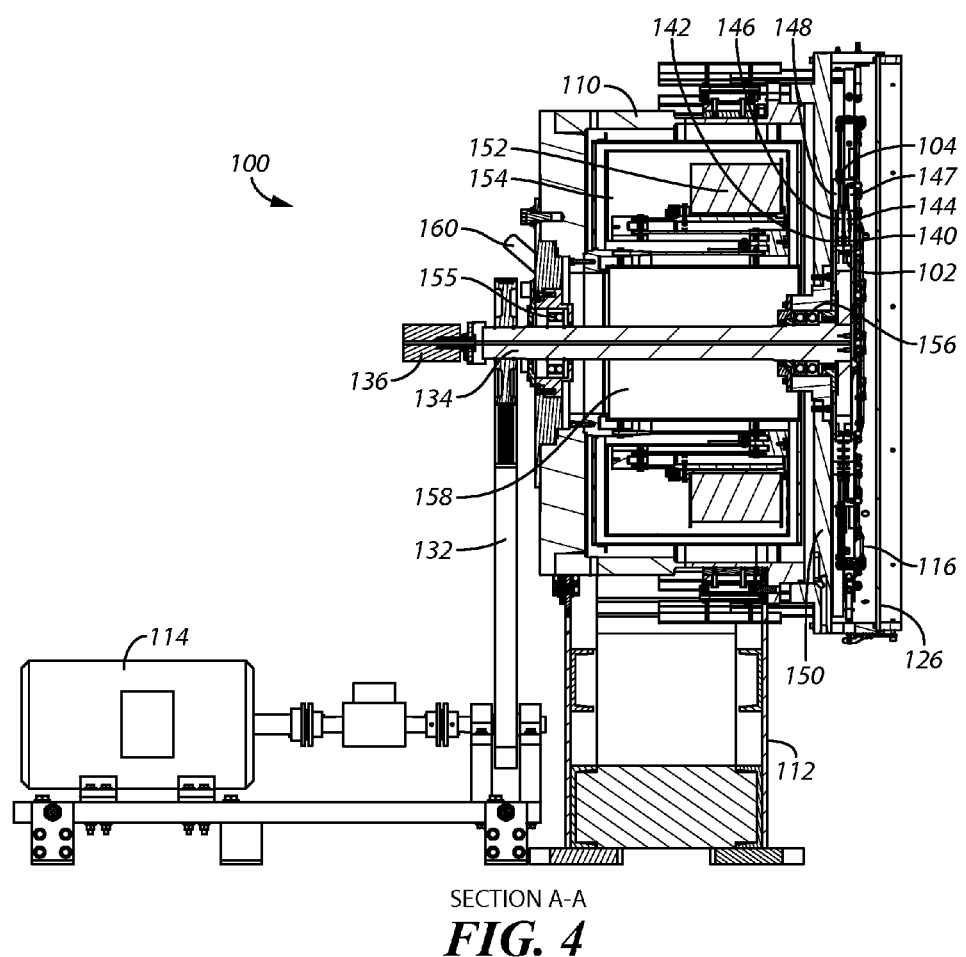
FIG. 4 is a side cross sectional diagram illustrating the magnetic test apparatus shown in FIG. 1 in accordance with various embodiments of the present invention.

Referring to FIG. 4 a side cross sectional diagram is shown illustrating the magnetic test apparatus shown in FIG. 1 in accordance with various embodiments of the present invention. Shown is the rotor 102, the stator 104, a first brush 140, a second brush 142, a first brush holder 144, a second brush holder 146, a first bus bar 147, a second bus bar 148, a back plate 150, the machine housing 110, the support structure 112, the drive system 114, the drive belt 132, the plurality of gas delivery tubes 116, a magnet 152, a magnet housing 154, the drive shaft 134, the water union 136, a first bearing 155, a second bearing 156, a center chamber 158, a gas delivery attachment 150, and the environmental chamber housing 126.

The first brush 140 is held by the first brush holder 144 and the second brush 142 is held by the second brush holder 146. The first brush holder 144 is connected to the first bus bar 147 on a front side of the stator 104 and the second brush holder is connected to the second bus bar 148 on a back side of the stator 104. As described above, the brush holders can be attached to either the front side or the back side of the stator 104, thus allowing for greater capacity to test the brushes.

The center chamber 158 and the gas delivery attachment 160 allow for the delivery of environmental gasses into vicinity of the brushes, the rotor 102, and the stator 104. The environmental chamber housing 126 (described above with reference to FIG. 1) on the front of the magnetic test apparatus 100 keeps the gas contained at the front of the magnetic test apparatus 100. This allows the brushes to be tested while in the presence of different types of environmental gases and varies pressure within the chamber. The environmental chamber 126, in one embodiment, encloses the stator, the rotor and the brushes. The environmental chamber 126 is sealed and various gaseous atmospheres, as delivered by an environmental control system, can be tested.

The magnet housing 154, in one embodiment, is a vacuum sealed, super-cooling chamber for a superconducting magnet. The superconducting magnet is cooled by the cyro-compressor 124. The superconducting magnet can generate large magnetic fields in the vicinity of the brushes, thus allowing for the testing of the brushes under conditions that simulate the real operation of motors.

The drive shaft 134 is supported by the first bearing 154 and the second bearing 156. In one embodiment, the first bearing 154 and the second bearing 156 are rolling element bearings. The bearings allow the drive shaft 134 to easily rotate. The drive shaft 134 is coupled to the rotor 102, thus as the drive motor is on the drive belt 132 rotates the drive shaft 134 which in turn rotates the rotor 102. Additionally, during operation the magnet 152 generates a magnetic field in the vicinity of the first brush 140 and the second brush 142. The rotor 102, the stator 104 and the brushes can be adjusted in an axial direction of the shaft by adjusting the position of the drive shaft 134. That is, the relative axial position of the brushes in relation to the magnetic 152 is adjustable. This adjustment allows for control over both the axial and radial components of the magnetic field (Bz and Br) in the vicinity of the brushes, thus allowing for a more controlled environment for testing.

The stator 104 is connected to the back plate 150 which is mounted to the machine housing 110. The first bus bar 147 and the second bus bar 148 can be easily accessed and allow for the relatively simple removal and replacement of the brush holders and/or brushes. As described above, in one embodiment, the stator 104 comprises four section where each section includes two stacked bus bars mounted to the back plate 150. The bus bars line up with the two rings of the double copper slip ring of the rotor 102. The brush holders are mounted to the bus bars and the brushes are then in contact with the rotor slip rings. The two bus bars are electrically isolated from each other and from the back plate 150.

Figure 5:
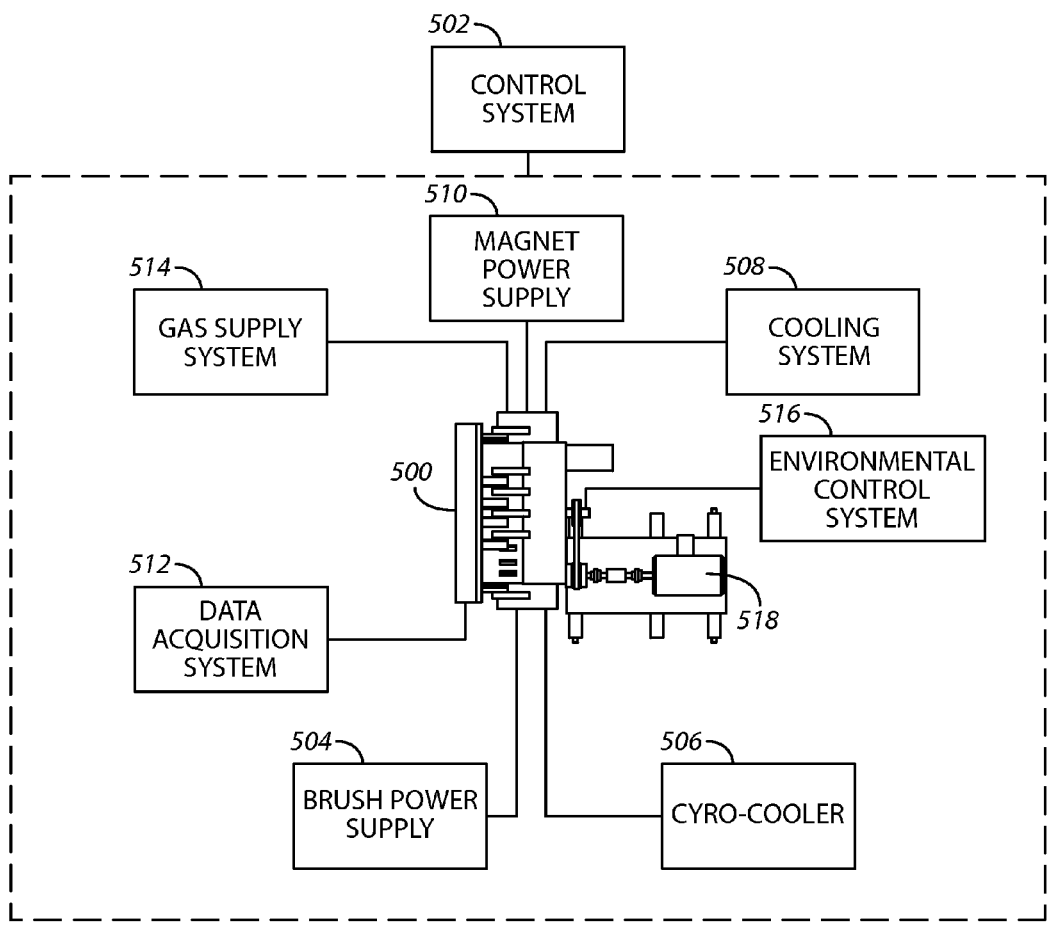
FIG. 5 is a system diagram illustrating a magnetic test apparatus system in accordance with various embodiments of the present invention.

Referring to FIG. 5 a system diagram is shown illustrating a magnetic test apparatus system in accordance with various embodiments of the present invention. Shown is a magnetic test apparatus 500, a control system 502, a brush power supply 504, a cyro-cooler 506, a chiller 508, a magnet power supply 510, a data acquisition system 512, a gas supply system 514, an environmental control system 516 and a drive motor 518.

The control system 502, in one embodiment, controls the operation of the entire system including the magnetic test apparatus 500, the magnet power supply 510, the brush power supply 504, the chiller 508, the environmental control system 516, the cyro-cooler 506, the gas supply system 514 and the data acquisition system 512. In an alternative embodiment, one or more of the individual components of the system are operated independently of the control system 502. For example, the data acquisition system 512 can be operated independently from the control system 502. The brush power supply 504 is connected to the magnetic test apparatus 500 and supplies current to the brushes the rotor, and the stator during operation. In one embodiment, the brush power supply 504 is a constant-current supply used to provide the current for testing the brushes. The brush power supply 504 is capable of providing up to 6,000 amps dc at up to 5 volts. The brush supply is a low ripple supply (<1% pk-pk of full current) even at low voltage. The power supply 504 consists of two commercial supplies, each rated at 3,000 amps, bused together in parallel. "Freewheeling" diodes provide protection for the brush supply 504 from the back EMF that can be generated by the movement of the rotor in the magnetic field. The brush power supply 504 control utilizes a master-slave configuration where the master settings are used to control both supplies. A DC power supply capable of delivering up to 26,000 Amps at 10 Volts may be connected to the stator bus bars. The current path delivered by the brush power supply 504 is through one stator bus bar; through the brush holders and brushes into the rotor slip ring; through the rotor into the second slip ring; out of the second slip ring through brushes and brush holders mounted to the second bus bar.

The magnet power supply 510 supplies power to the magnet during operation in order to induce a magnetic field in the vicinity of the brushes. The cyro-cooler 506 cools the magnet during operation. As described above, in one embodiment, the magnet is a superconducting magnet that is cooled to 4.2 degrees Kelvin. The gas supply system 514 provides gas to the brush holders which in turn controls the pressure that the brushes are contacting the rotor. The chiller 508 provides cooling for the rotor and stator during operation. The drive motor 518 is, for example, a variable frequency motor that is coupled to the shaft through a drive belt. The drive motor 518 turns the shaft which then turns the rotor during operation.

The environmental control system 516 supplies environmental gasses to the environmental chamber of the magnetic test apparatus 500. This allows the brushes to be tested under different pressure and environmental conditions.

The data acquisition system 512 is connected to the magnetic test apparatus 500 and collects data about the temperature, pressure within the environmental chamber of the magnetic test apparatus. The data acquisition system 512, in one embodiment, is a standard system including sensors and data logging equipment, such as, a computer system. The data acquisition system 512, in one embodiment, is connected to sensors designed to measure temperature, voltage drop, brush wear, humidity, oxygen concentration, pressure, speed and many other parameters at various points. In particular, stator bus bar, brush holder, brush, and rotor slip ring temperatures are measured. In one embodiment, up to 175 channels are allocated for instrumentation with the majority of the measurement signals being recorded on by the data acquisition system 512.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

We claim:

1. A magnetic test apparatus comprising:
   a rotor coupled to a drive shaft, wherein the drive shaft is mechanically coupled to a drive system;
   a stator coupled to at least one brush holder;
   at least one brush held by the at least one brush holder, wherein the at least one brush is held in contact with the rotor;
   a housing for supporting the rotor and the stator;
   a magnet for providing a magnetic field in the vicinity of the at least one brush; and
   a magnet housing for housing the magnet,
   wherein the magnet comprises a superconducting magnet, and
   wherein the magnet housing comprises a vacuum sealed super-cooling housing.

2. The magnetic test apparatus of claim 1, further comprising at least one gas supply tube to deliver gas to the at least one brush holder in order to control the contact pressure of the at least one brush to the rotor.

3. The magnetic test apparatus of claim 1 further comprising an environmental chamber enclosing the rotor and the at least one brush.

4. The magnetic test apparatus of claim 3 further comprising at least one data acquisition connector.

5. The magnetic test apparatus of claim 1 further comprising:
   a first power supply connector for supplying power to the at least one brush; and
   a second power supply connector for supplying power to the magnet.

6. The magnetic test apparatus of claim 1 wherein the drive system compromises a motor and drive belt coupled to the drive shaft.

7. The magnetic test apparatus of claim 1 further comprising a support structure for supporting the housing, the stator, the rotor and the drive shaft.

8. A magnetic test apparatus systems comprising:
   a magnetic test apparatus comprising:
      a stator;
      at least one brush holder coupled to the stator;
      a at least one brush held by the at least one brush holder;
      a rotor position to contact the at least one brush;
      a drive shaft coupled to the rotor; and
      a magnet for supplying a magnetic field where the at least one brush contacts the rotor; and
      a magnet housing for housing the magnet,
      wherein the magnet comprises a superconducting magnet, and
      wherein the magnet housing comprises a vacuum sealed super-cooling housing,
   a drive system coupled to the drive shaft;
   a power supply for providing power to the at least one brush; and
   a power supply for providing power to the magnet.

9. The magnetic test apparatus system of claim 8 further comprising an environmental chamber enclosing the rotor and the at least one brush.

10. The magnetic test apparatus system of claim 9 further comprising a data acquisition system coupled to the magnetic test apparatus.

11. The magnetic test apparatus system of claim 9 further comprising an environmental delivery system for supplying gas to the environmental chamber.

12. The magnetic test apparatus system of claim 8 further comprising a gas delivery system for supplying gas to the at least one brush holder.

13. The magnetic test apparatus system of claim 8 further comprising a chiller coupled to the magnetic test apparatus for controlling the temperature of the rotor and at least one brush.

14. The magnetic test apparatus system of claim 8, further comprising a cryo-cooler for cooling the superconducting magnet.

15. A method of testing at least one brush, comprising:
rotating a rotor of a magnetic test apparatus;
providing power from a brush power supply to at least one brush in contact with the rotor;
providing power from a magnet power supply to a magnet; and
generating a magnetic field from the magnet in the vicinity of the at least one brush and the rotor; and
providing a magnet housing for housing the magnet,
wherein the magnet comprises a superconducting magnet, and
wherein the magnet housing providing step comprises providing a vacuum sealed super-cooling housing.

16. The method of claim 15 further comprising acquiring data related to the operation of the at least one brush.

17. The method of claim 16 further comprising providing gas to an environmental chamber enclosing the rotor and the at least one brush.

18. The method of claim 17 further comprising acquiring at least one of temperature data and pressure data within the environmental chamber.

* * * * *

UNITED STATES PATENT AND TRADEMARK OFFICE
CERTIFICATE OF CORRECTION

| | |
|---|---|
| PATENT NO. | : 7,642,806 B2 |
| APPLICATION NO. | : 11/549587 |
| DATED | : January 5, 2010 |
| INVENTOR(S) | : Piec et al. |

It is certified that error appears in the above-identified patent and that said Letters Patent is hereby corrected as shown below:

Claim 8, column 8, line 38, delete "systems" and insert --system,--.
    Claim 8, column 8, line 42, delete "a at least" and insert --at least--.

Signed and Sealed this

Eleventh Day of May, 2010

David J. Kappos
*Director of the United States Patent and Trademark Office*